(12) United States Patent
Pulwey et al.

(10) Patent No.: US 9,136,090 B2
(45) Date of Patent: Sep. 15, 2015

(54) METHOD AND APPARATUS FOR SCANNING A SURFACE OF AN OBJECT USING A PARTICLE BEAM

(71) Applicants: Ralph Pulwey, Aalen (DE); Josef Biberger, Wildenberg (DE)

(72) Inventors: Ralph Pulwey, Aalen (DE); Josef Biberger, Wildenberg (DE)

(73) Assignee: CARL ZEISS MICROSCOPY GMBH, Jena (DE)

( * ) Notice: Subject to any disclaimer, the term of this patent is extended or adjusted under 35 U.S.C. 154(b) by 0 days.

(21) Appl. No.: 13/905,067

(22) Filed: May 29, 2013

(65) Prior Publication Data

US 2013/0320226 A1 Dec. 5, 2013

(30) Foreign Application Priority Data

May 30, 2012 (DE) .......................... 10 2012 010 707

(51) Int. Cl.
*H01J 37/302* (2006.01)
*H01J 37/317* (2006.01)
*H01J 3/26* (2006.01)
*H01J 37/305* (2006.01)

(52) U.S. Cl.
CPC ............... *H01J 37/3026* (2013.01); *H01J 3/26* (2013.01); *H01J 37/302* (2013.01); *H01J 37/3023* (2013.01); *H01J 37/3056* (2013.01); *H01J 37/3174* (2013.01); *H01J 2237/1536* (2013.01); *H01J 2237/30483* (2013.01); *H01J 2237/30488* (2013.01)

(58) Field of Classification Search
CPC ............... H01J 2237/3175; H01J 2237/31761; H01J 2237/31762; H01J 2237/31764; H01J 37/3174; H01J 2237/3174; H01J 2237/30488; H01J 37/302; H01J 2237/1536; H01J 37/3023; H01J 37/3026; H01J 37/3045
USPC .......... 250/396 R, 398, 491.1, 492.2, 492.22, 250/492.23
See application file for complete search history.

(56) References Cited

U.S. PATENT DOCUMENTS

| | | | |
|---|---|---|---|
| 3,956,635 A * | 5/1976 | Chang | 250/492.2 |
| 4,546,232 A | 10/1985 | Beisswenger et al. | |
| 5,030,836 A * | 7/1991 | Kusui et al. | 250/492.3 |
| 5,393,987 A * | 2/1995 | Abboud et al. | 250/492.22 |
| 2003/0006217 A1 | 1/2003 | Dance | |

(Continued)

FOREIGN PATENT DOCUMENTS

| | | |
|---|---|---|
| DE | 32 40 654 A1 | 5/1984 |
| DE | 694 29 498 T2 | 12/1994 |

(Continued)

OTHER PUBLICATIONS

L. Reimer, Scanning Electron Microscopy, Physics of Image Formation and Microanalysis, Springer-Verlag, 1985, pp. 119-123.

(Continued)

*Primary Examiner* — Michael Logie
(74) *Attorney, Agent, or Firm* — Alston & Bird LLP (57) ABSTRACT

A method of scanning a surface of an object using a particle beam comprises: determining a surface portion of the surface of the object, wherein the surface portion is to be scanned; determining initial positions of a set of raster points within the surface portion; changing the positions of at least some raster points of the set of raster points; and then scanning the surface portion by directing the particle beam to the positions of the raster points.

19 Claims, 7 Drawing Sheets

(56) References Cited

U.S. PATENT DOCUMENTS

| | | | |
|---|---|---|---|
| 2004/0104354 A1 | 6/2004 | Haberer et al. | |
| 2008/0160431 A1* | 7/2008 | Scott et al. | 430/5 |
| 2010/0301235 A1* | 12/2010 | Bert et al. | 250/492.3 |
| 2011/0198497 A1* | 8/2011 | Biberger et al. | 250/307 |
| 2012/0238795 A1* | 9/2012 | Bert et al. | 600/1 |
| 2013/0180962 A1* | 7/2013 | Biberger et al. | 219/121.15 |

FOREIGN PATENT DOCUMENTS

| | | |
|---|---|---|
| DE | 100 57 824 A1 | 6/2002 |
| JP | 57-010236 A | 1/1982 |

OTHER PUBLICATIONS

A. Yasaka et al.: "Application of vector scanning in focused ion beam photomask repair system", Journal of Vacuum Science and Technology B, vol. 26, No. 6, Nov./Dec. 2008, pp. 2127-2130.

H.W.P. Koops et al.: "High-resolution electron-beam induced deposition", Journal of Vacuum Science and Technology B, vol. 6, No. 1, Jan./Feb. 1988, pp. 477-481.

Office Action dated Jan. 30, 2013 in German patent application No. 10 2012 010 707.2 (7 pp.) with English-language translation (6 pp.).

Office Action dated May 7, 2013 in German patent application No. 10 2012 010 707.2 (4 pp.) with English-language translation (3 pp.).

Extended European search report in European patent application No. 13 002 790.7 dated Aug. 14, 2013.

* cited by examiner

METHOD AND APPARATUS FOR SCANNING A SURFACE OF AN OBJECT USING A PARTICLE BEAM

CROSS-REFERENCES TO RELATED APPLICATIONS

This application claims priority of Patent Application No. 10 2012 010 707.2, filed May 30, 2012 in Germany, the entire contents of which are incorporated by reference herein.

FIELD

The present invention relates to methods and apparatuses for scanning a surface of an object using a particle beam.

BACKGROUND

Particle beams are commonly used to manipulate objects and, in particular, miniaturized objects. For example, a particle beam can be directed onto a surface of an object to remove material from the object or to deposit material on the object. This process can be enhanced by supplying a process gas to the object, wherein the process gas is activated by the incident particle beam such that products of the activation are deposited on the surface of the object at or close to the location of incidence of the particle beam, or such that products of the activation form compounds with particles of the object which are removed from the object. The particle beam can be an electron beam or an ion beam.

If it is desired to remove material from or deposit material on a surface of an object within only a surface portion of the total surface of the object, the particle beam is conventionally scanned line by line across the surface portion. In such process, a scan direction is selected, and the particle beam is subsequently directed to plural positions arranged on a line oriented in the scan direction. If an edge of the surface portion is reached, the processing proceeds with a next line displaced from the previous line in a sub-scan direction, and so on.

It has been found that results achieved by scanning surface portions of an object along subsequent lines does not always meet the expectations.

SUMMARY

It is an object of the present invention to suggest alternative methods and apparatuses for scanning a surface of an object using a particle beam.

According to some embodiments, a method of scanning a surface of an object using a particle beam comprises determining a surface portion of the surface of the object, wherein the surface portion is to be scanned; determining initial positions of a set of raster points within the surface portion; changing the positions of at least some raster points of the set of raster points; and then scanning the surface portion by directing the particle beam to the positions of the raster points.

The surface portion is, for example, determined based on a shape and lateral extension of an area on the object surface where a manipulation using the particle beam is to be performed. If it is desired, for example, to produce a rectangular indentation in the object surface, the surface portion will have a rectangular shape and size corresponding to the desired indentation.

The term "raster point" as used in the present disclosure should not be understood in the sense of a mathematical point which is an object of infinitesimally small extension on a surface. The term "raster point" should be understood as a spot or dot having a lateral extension on the surface and formed by an intensity profile which the particle beam applies to the surface when the particle beam is directed onto the surface such that a center or main axis of the extended particle beam is directed onto a mathematical point on the surface. The particle beam has a finite cross-section which is not precisely defined. For example, the intensity profile of a particle beam incident on a surface may have a Gaussian distribution. It is common practice to define a beam radius as a distance from the beam axis at which the beam intensity is half of the maximum intensity at the beam center. Therefore, the term "raster point" can designate a circular element located on the surface of the object, wherein the radius of the circular element is equal to the radius of the particle beam. If the central axis of the particle beam is directed to the center of the circular element for a given duration, the particle intensity per unit area applied to the object within the circular element is higher than half of the maximum intensity obtained at the center of the circular element. It is apparent that a lateral extension within the plane of the surface of the object can be associated with the raster point, accordingly.

According to some embodiments herein, the determining of the initial positions of the set of raster points within the surface portion is performed by first determining an initial position of a first raster point such that it is located at an edge of the surface portion. Thereafter an initial position of subsequent raster point is repeatedly determined by such that each subsequent raster point is located at the edge of the surface portion and immediately adjacent to the raster point whose position has been determined immediately before.

In this context, two raster points of the set of raster points are located immediately adjacent to each other if no other raster point exists which is located between the two immediately adjacent raster points.

The above repeated determination of initial positions of raster points can be repeated until the last subsequent raster point is located immediately adjacent to the first raster point.

Now the edge of the surface portion is completely filled with raster points, wherein the outer contour of the set of raster points corresponds well with the outer contour of the surface portion. In particular, the outer contour of the set of raster points has a corresponds better to the outer contour of the surface portion as compared to a situation in which the conventional line scan method is used for scanning the surface portion of the object. In such line scan, the positions of the raster points are predetermined positions arranged in a two-dimensional regular rectangular lattice. If a certain portion of the outer contour is oriented diagonal to a lattice direction of the rectangular lattice, the positions of the raster points used for scanning of the surface portion provide a step-shaped outer contour which does not well approximate the outer contour of the surface portion.

As soon as the edge of the surface portion to be scanned is filled with raster points, the method can proceed by determining initial positions of raster points within the surface portion by repeatedly determining the initial position of a subsequent raster point such that the subsequent raster point is located immediately adjacent to the raster point whose position has been determined immediately before and such that it is located immediately adjacent to a raster point whose position has been determined before, i.e. whose position has been determined not immediately before but two or more steps before. By such processing, the surface portion is successively filled with raster points from the outside to the inside.

Such determining of initial positions of the raster points may result in non-uniform distances between adjacent raster points within the surface portion, and such non-uniform distances between adjacent raster points may result in an inhomogeneous distribution of a particle dose across the surface portion when the particle beam is subsequently scanned across the surface portion by directing the beam to the initial position of the raster points.

Therefore, the positions of at least some raster points of the set of raster points are changed before the surface portion is scanned using the particle beam by directing the beam to the then changed positions of the raster points.

According to exemplary embodiments, the changing of the positions of at least some raster points of the set of raster points includes the changing of the positions of at least one raster point by an amount which corresponds to more than 0.1 times, more than 0.2 times or more than 0.3 times of an average distance between immediately adjacent raster points located within the surface portion. According to other exemplary embodiments, the changing of the positions of at least some raster points of the set of raster points includes the changing of the positions of at least one raster point by an amount which corresponds to more than 0.05 times, more than 0.1 times or more than 0.2 times of a diameter of the particle beam used for scanning, wherein the diameter of the beam is determined as illustrated above, i.e. the particle intensity at the beam radius is half of the maximum intensity at the beam center.

According to some exemplary embodiments, the changing of the positions of at least some raster points of the set of raster points includes the changing of the positions of more than 5, more than 10 or in particular more than 100 positions of raster points. According to other exemplary embodiments, the changing of the positions of at least some raster points of the set of raster points includes the changing of more than 0.001 times the number of raster points in the set, more than 0.01 times the number of raster points in the set, or more than 0.1 times the number of raster points in the set.

According to some embodiments, the changing of the positions of the at least some raster points of the set of raster points is performed such that local deviations of a particle dose from a predetermined target dose occurring when the surface portion is scanned by directing the particle beam to the changed positions are smaller than local deviations of a particle dose from the predetermined target dose occurring if the surface portion were scanned by directing the particle beam to the initial positions of the set of raster points within the surface portion. The target dose per unit area is typically defined by the task to be performed. For example, if a layer of a given material and given thickness is to be deposited within the surface portion, the skilled person will select a suitable process gas, determine resulting deposition rates and calculate a corresponding particle dose per unit area necessary for activating the process gas such that the layer of the desired thickness is deposited. The target dose can be a constant dose for the whole surface portion to be scanned. It is, however also possible that the target dose is a function of the position within the surface portion. For example, the target dose may increase within the surface portion from left to right if a slanted structure is to be manufactured. The local particle dose at a given position can be calculated, for example, by averaging the particle doses generated from the beam directed to a number of raster points in the vicinity of the given position. For example, the particle dose incident on a circular surface having its center at the given position and a radius of, for example, 3 times, 5 times or 10 times the diameter of the raster points in the surface plane can be calculated for a given arrangement of raster points in the region of the given position. This dose can be divided by the surface of the circle to obtain the local particle dose per unit area, and the local particle dose per unit area can be compared with the desired target dose to determine whether the local particle dose should be decrease or increase by changing positions of the raster points in the vicinity of the given location.

According to some embodiments, the changing of the positions of the some raster points of the set of raster points is repeatedly performed, i.e. in an iterative process until, for example, local deviations of the expected particle dose from a target dose are smaller than a predetermined threshold value.

According to some embodiments, the changing of the positions of the at least some raster points does not include changing of the positions of all raster points of the set, such that the positions of only a subset of the set of raster points are changed. The subset may contain less than 90%, less than 80% or less than 70% of the number of raster points contained in the set. The positions of those raster points not contained in the subset are fixed to the determined initial positions and are not changed.

According to some embodiments, all raster points located at an edge of the surface portion or at least 80% of the raster points located at the edge of the surface portion are not contained in the subset of raster point whose positions are changed. This may have an advantage in that the changing of the positions of the raster points occurs in an interior of the surface portion with respect to reducing deviations of the particle dose from a target dose, and wherein positions of raster points located on or close to the edge of the surface portion are not changed such that the contour of the set of raster points is substantially not changed and corresponds to the contour of the surface portion.

According to some exemplary embodiments of the method, the particle beam is directed exactly once onto each raster point. According to alternative exemplary embodiments, the particle beam is directed plural times onto each raster point, wherein it is in particular possible, that the particle beam is directed to each of the raster points a same number of times.

According to further exemplary embodiments, the particle beam is directed to each raster point such that it is maintained on the respective raster point for a predetermined duration (dwell time). According to exemplary embodiments herein, the predetermined duration is substantially greater, for example more than 10 times greater, than a time necessary to move the beam from one raster point to the immediately subsequent raster point to be scanned.

According to some exemplary embodiments, the particle beam is an electron beam.

According to other exemplary embodiments, the particle beam is an ion beam. Moreover, it is possible to apply the principles illustrated in this disclosure also to a system in which a laser beam is used to manipulate an object by supplying radiant energy to the object. In such system, a method is used in which positions of a set of raster points are determined on a surface of an object and in which the laser beam is directed to those raster points.

According to further exemplary embodiments, a process gas is supplied to the surface of the object together with the particle beam.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

Figure 1:
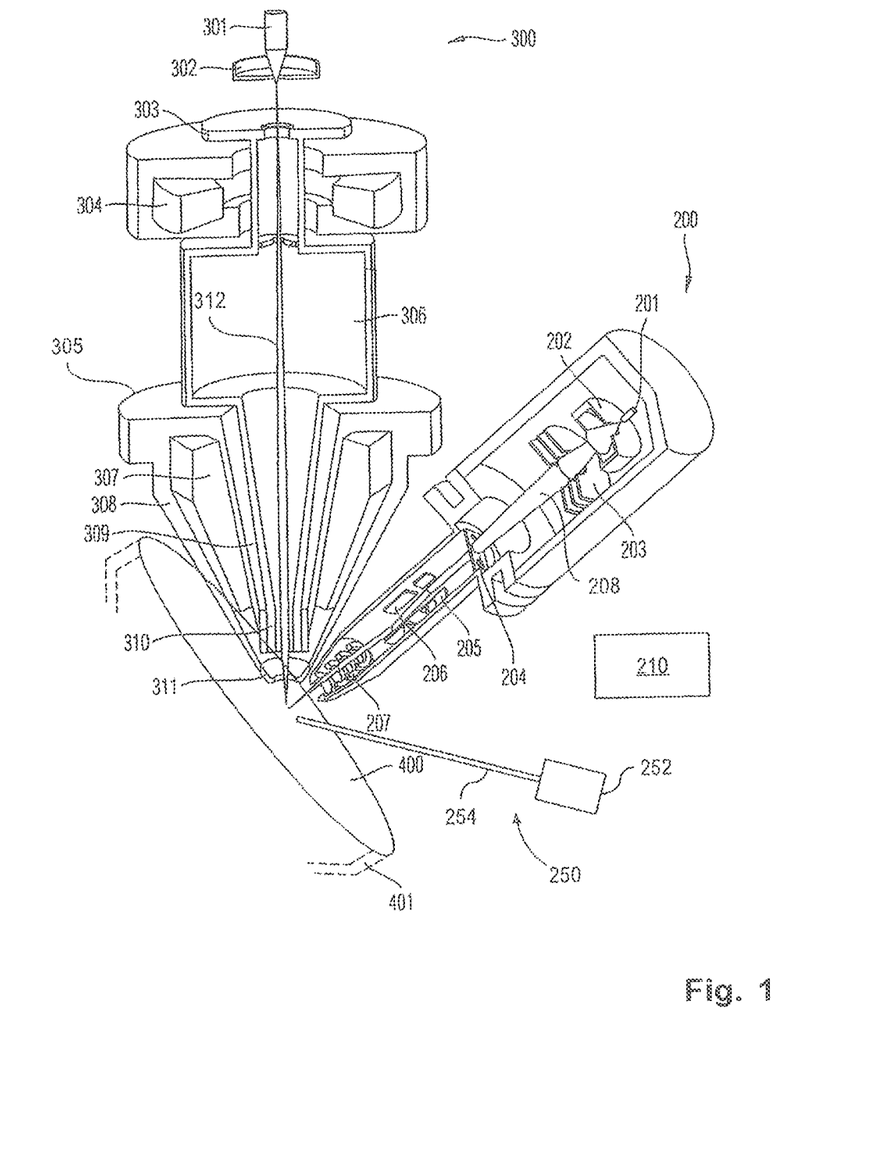
FIG. 1 is a schematic illustration of a particle beam system used for scanning a particle beam across a surface of an object.

FIG. 1 is a simplified schematic illustration of a system for inspecting and processing of an object using particle beams. The system comprises an electron microscopy system 300 for imaging a region of an object 400, and an ion beam processing system 200 for manipulating the object 400. As can be seen from FIG. 1, the electron microscopy system 300 and the ion beam processing system 200 are arranged relative to each other such that both an electron beam 312 and an ion beam 208 can be incident on a same region of the object 400.

The electron beam 312 is generated by an electron beam source comprising a cathode 301, such as a Schottky-field-emitter, and an anode 303 opposite to the cathode 301. The emitted electrons traverse an extractor 302 arranged between the cathode 301 and the anode 303. The accelerated electrons further traverse an aperture of the anode 303 and are collimated by a condenser 304. The electrons then traverse a volume 306 in which a detector (not shown in FIG. 1) for detecting secondary electrons or backscattered electrons is arranged. An objective lens 305 having an inner pole piece 309, an outer pole piece 308 and a coil body 307 located between the inner and outer pole pieces in order to generate a focusing magnetic field. The objective lens 305 further comprises electrodes 310 and 311 for generating a decelerating electrostatic field.

The electron microscopy system 300 further comprises beam deflectors for deflecting the electron beam and to scan the beam across the surface of the object 400, wherein secondary electrons and/or backscattered electrons are detected for generating an electron microscopic image of the surface of the object. These images can be used to monitor and to control a processing of the object using the ion beam processing system 200.

The ion beam processing system 200 comprises an ion source 201 and an extraction electrode 202 for extracting an ion beam from the source. The ion beam traverses a collimator 203, a variable aperture 204, deflection electrodes 205 and 206 and focusing lenses 207 in order to focus the ion beam 208 in a region of the surface of the object 400. A controller 210 is provided to control the generation of the ion beam and a location of incidence of the beam 208 on the surface of the object 400 by controlling the deflection electrodes 205, 206.

The system further comprises a gas supply system 250 for supplying a process gas from a gas reservoir 252 via a supply conduit 254 to the surface of the object such that the gas is emitted from the supply conduit 254 at a location close to a location of incidence of the electron beam 312 and of the ion beam 208 on the object 400. The process gas supplied to the surface of the object 400 can be activated by the ion beam 208 or the electron beam 312 and/or by other particles, such as secondary electrons released from the object due to the incidence of the electron beam and the ion beam, respectively. The activated process gas may react with the material of the object such that material is deposited on the object or removed from the object at the location of incidence of the ion beam and the electron beam, respectively, on the object and in a region close to this location of incidence. Thus, the deposition of material on the object and/or the removal of material from the object is controlled by the ion beam or electron beam incident on the object.

In some applications, it is desired to deposit material on or to remove material from the surface of the object within a predetermined extended surface portion of the object. For this purpose, the ion beam (or the electron beam) has to be scanned across the predetermined surface portion such that a necessary particle dose per unit area is supplied to those regions of the object where the removal of material from and deposition of material on the object, respectively, is desired.

Methods of scanning the surface of an object using an ion beam or an electron beam will be illustrated below, wherein a particle dose is substantially homogenously distributed within a predetermined surface portion of the object.

Figure 2:
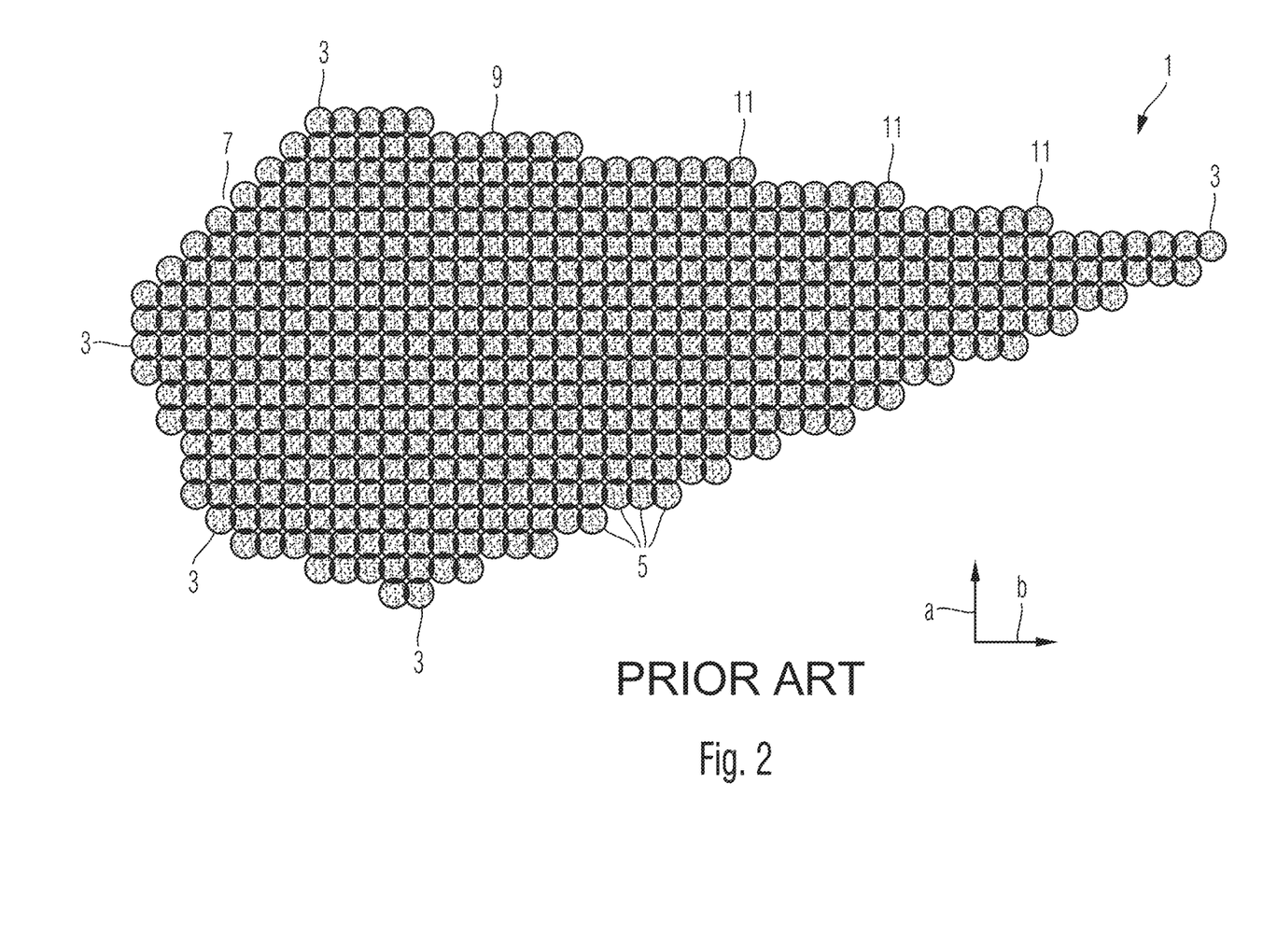
FIG. 2 is a schematic illustration of an arrangement of raster points according to a comparative example.

FIG. 2 shows an arrangement of positions of raster points used in a conventional alternative method, wherein the raster points are arranged in a regular array or two-dimensional lattice.

The surface portion 1 to be scanned has a shape of a polygon having five corners 3 connected by straight lines. The positions of the raster points 5 are arranged according to a regular lattice having lattice vectors represented by vectors a and b in FIG. 1. The raster points 5 located within the polygon are members of the set of raster points to be scanned. Raster points positioned outside of the polygon such that centers of the circular elements representing the raster point are outside of the lines connecting the corners are not shown in FIG. 2.

It is apparent that, for example, an edge 7 of the surface portion can be well approximated by this arrangement of raster points since the edge extends under an angle of about 45° relative to the two lattice vectors a and b of the lattice. However, the edge 9 of the surface portion is not so well reproduced by this distribution of raster points since the edge 9 extends under an angle relative to the lattice vectors a and b such that steps 11 are formed which do not well correspond with the straight edge 9 connecting the two corners 3.

However, it is desirable in many applications to perform a processing using a particle beam in which a deposition of material on an object or a removal of material from an object is required for producing an indentation or a recession in an object surface or a projection or protrusion from the surface having an edge or contour corresponding well to a desired shape of the contour or edge.

Figure 3:
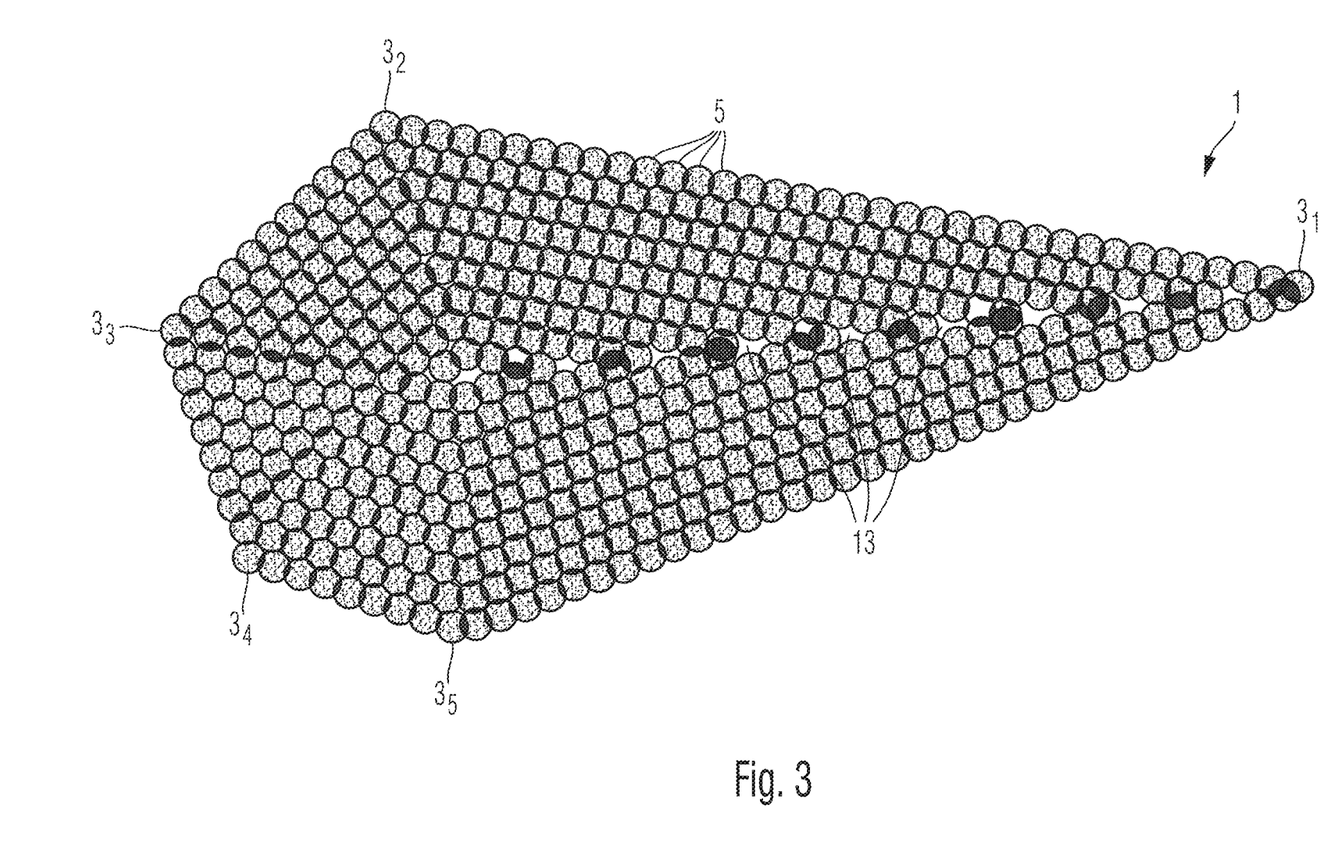
FIG. 3 is a schematic illustration of an arrangement of raster points according to an embodiment of a method of scanning a surface of an object, wherein positions of the raster points are initial positions, before positions of at least some raster points are changed.

FIG. 3 shows an arrangement of raster points 5 within a surface portion 1 having a same shape as the surface portion shown in FIG. 2, wherein the arrangement of the raster points 5 is achieved using a different method. It is apparent that the arrangement of the raster points 5 according to FIG. 3 very well represents the straight edges of the polygon. This is possible since the raster points 5 are not arranged on a regular two-dimensional lattice. The shown arrangement can be achieved, for example, by placing the raster points in subsequent steps on places within the surface portion, wherein, in each step, the position of the next raster point to be placed is determined based on the shape of the surface portion and based on the raster points which have already been placed within the surface portion. For example, a first raster point can be placed in a first corner $3_1$ of the polygon. A second raster point is then placed immediately adjacent to the first raster point and at the edge extending between the first corner $3_1$ and a second corner $3_2$. This processing is continued such that a position of a next raster point is determined in each step, wherein the position of the next raster point is determined such that it is located on the edge between the corners $3_1$ and $3_2$ and immediately adjacent to the raster point whose position has been determined immediately before. This processing is continued until the second corner $3_2$ is reached. Such stepwise processing is continued by placing raster points along the edge between the second corner $3_2$ and a subsequent, third corner $3_3$, until the corner $3_3$ is reached. The processing is then continued by placing raster points on the edge between the third corner $3_3$ and the fourth corner $3_4$. Thereafter, the processing is continued by placing raster points on the edge between the corner $3_4$ and the next and last, fifth corner $3_5$. Finally, raster points are placed on the edge between the fifth corner $3_5$, and the first corner $3_1$ until the first corner $3_1$ is reached. Now, raster points are placed along all edges of the polygon, and the processing continues by placing raster points along a second row within the surface portion. Again, steps are repeatedly performed, wherein, in each step, a position of a next raster point is determined such that it is immediately adjacent to the raster point whose position has been determined in the immediately preceding step and immediately adjacent to a raster point whose position has been determined two or more steps before the current step. By such processing, the surface portion can be filled with raster points spiraling from the outside to the inside until the surface portion 1 is completely filled with raster points such that no further raster point fits into the surface portion.

From FIG. 3 it is apparent that such determining of positions of raster points within a surface portion has an advantage that the set of raster points approximates the edges of the polygon, i.e. the contour of the surface portion very well. However, white regions 13 shown in FIG. 3 remain, wherein these regions 13 are not covered with raster points. Other dark regions shown in FIG. 3 having a significant dimension are covered by more than one raster point. When the particle beam is subsequently directed to the raster points shown in FIG. 3, this results in a non-uniform distribution of the particle dose, wherein a low particle dose is directed to the white regions 13 of FIG. 1 and a high particle dose is directed to the extended dark region of FIG. 2. However, it is desirable to direct a substantially constant particle dose per unit area onto the whole surface portion.

Figure 4:
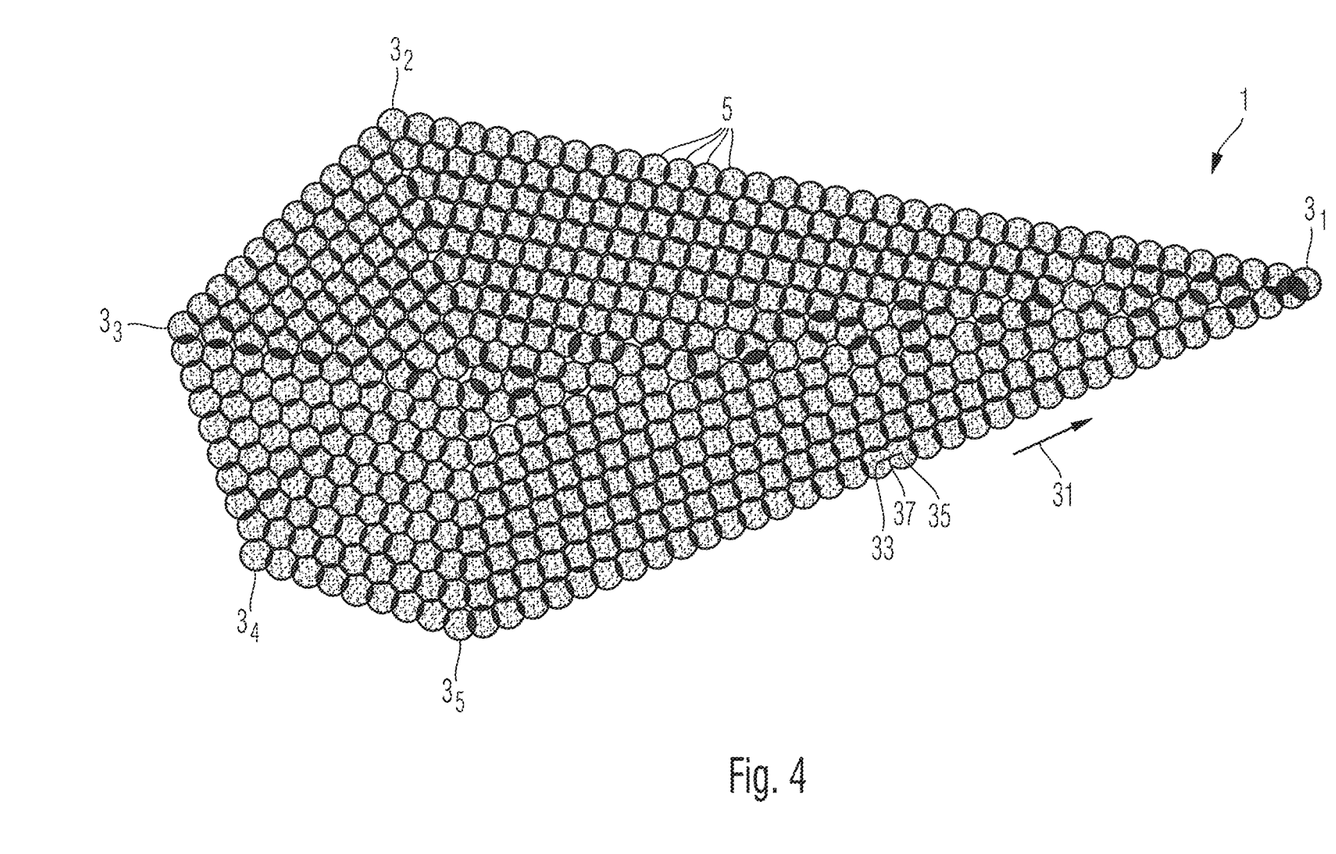
FIG. 4 is a schematic illustration of an arrangement of raster points resulting from the arrangement shown in FIG. 3 by changing of positions of at least some raster points.

FIG. 4 shows a distribution of raster points within a surface portion 1 having a same shape as the surface portion shown in FIG. 3 and wherein both the edges of the surface portion are well approximated and the apparent inhomogeneities of the particle dose present in the white regions 13 of FIG. 3 and the extended dark regions of FIG. 3 are no longer present in FIG. 4. The arrangement of raster points shown in FIG. 4 is obtained from the initial arrangement of raster points shown in FIG. 3 by changing depositions of some of the raster points. In particular, positions of raster points located close to the white regions 13 of FIG. 3 in which the particle dose is too low, have been slightly changed in order to reduce local deviations of the particle dose from a predetermine target dose. This can be achieved, for example, by displacing the positions of raster points located close to the white regions 13 in FIG. 2 by a distance determined by a random number generator, and use the generated new position of the raster point as a valid new position if the new position results in a reduction of deviations of a simulated local particle dose in a region around the considered raster point.

Such step of displacement of a raster point can be performed for each raster point located at or close to a white region 13 in FIG. 3 where the particle intensity is relatively low. Such procedure results in a new arrangement of the raster points within the surface portion 1 according to the changed positions of the raster points. Thereafter, a new search can be performed for regions in which a local particle dose deviates from a target dose, and the positions of raster points at or close to this regions can be further changed as illustrated above. Such processing can be repeatedly performed until regions where local deviations of the particle dose from the target dose exceed, for example, a predetermined threshold value, can no longer be found. Such steps or plural steps of changing of positions of raster points can be in particular performed only for a subset of the set of raster points, wherein the raster points of the subset are not positioned at or close to the edge of the surface portion. This achieves the advantage that deviations of the particle dose from the target dose are reduced in the interior of the surface portion, while the shape or contour of the surface portion defined by the positions of the raster points at the edge of the surface portion is not changed.

Thereafter, the surface portion can be scanned using the particle beam by directing the particle beam onto the positions of the raster points. Herein, the particle beam can be directed to the raster points in an order corresponding to the order in which the raster points have been initially placed in the surface portion, i.e. in the example of FIG. 4, starting with the corner $3_1$, following the edge to corner $3_2$ and the other edges until edge $3_1$ is reached and, then, spiraling from the outside to the inside of the surface portion 1 until the center is reached. It is, however, also possible to direct the particle beam to the raster points in the opposite order, i.e. starting from the center of the surface portion spiraling outwardly until the edge from corner $3_2$ to corner $3_1$ is scanned last. Moreover, it is possible to direct the particle beam to the raster points in an order in which raster points located immediately adjacent to each other are not scanned temporally immediately after each other. It is, for example, possible to scan raster points temporally immediately adjacent to each other which are not located immediately adjacent to each other, such that two or more raster points are located between two raster points which are scanned immediately after each other. This may have an advantage if a processing at a given raster point results in a depletion of process gas in a surrounding area of the processed raster point such that an immediately subsequent processing of the immediately adjacent raster point would result in an unsatisfactory result of the processing due to a local lack of process gas.

Using the illustrated method, it is possible to distribute raster points within a surface portion to be scanned such that all regions of the surface portion receive a substantially same particle dose and such that differences between a maximum local particle dose and a minimum local particle dose are relatively small, and such that a manufactured structure, such as an indentation or a protrusion, have a well define edge corresponding to the desired contour of the surface portion. This allows to achieve desired straight or curved edges of the manufactured structures which do not include undesired steps as those shown by reference numeral 11 in FIG. 2. This property is further illustrated with reference to FIG. 4 below. An arrow 31 in FIG. 4 represents a direction of extension of the edge of the polygon between the corners $3_5$ and $3_1$. Two exemplary raster points 5 which are located immediately adjacent to each other have centers 33 and 35, respectively. A connecting line between the centers 33 and 35 carries reference numeral 37. The connecting line 37 is parallel to the direction of extension 31 of the edge in a region close to the connecting line 37. The connecting line 37 is also parallel to the straight line connecting corners $3_5$ and $3_1$. In the example shown in FIG. 4, the connecting lines between each of the immediately adjacent pairs of raster points located on the edge between the corners $3_5$ and $3_1$ are exactly parallel to the direction of extension 31 of the edge. Similarly, this is the case for all pairs of raster points located on the other edges of the polygon. Connecting lines between immediately adjacent pairs of raster points on the edge are always parallel to the direction of extension of the corresponding edge of the surface portion.

In this respect, the arrangement shown in FIG. 4 represents the ideal case. In practice, it is possible to deviate from such ideal arrangement of the raster points at the edges of the surface portion. For example, some connecting lines between immediately adjacent pairs of raster points located at the edge of the surface portion may extend transversely or at an certain angle to the direction of extension of the edge of the surface portion. Such angle may amount to, for example, 10° or 20°. Moreover, the above condition need not be fulfilled for all raster points located at the edge of the surface portion. It can be sufficient that, for example, more than 90% or more than 80% of the raster points located at the edge of the surface portion fulfill the above condition such that an angle between an orientation of the connecting line between immediately adjacent pairs of raster points and the direction of extension of the edge of the surface portion is smaller than 20° or smaller than 10°.

The arrow 31 in FIG. 4 represent the direction of extension of the surface portion, and the above mentioned angle of the orientation of the connecting line 37 is defined relative to this direction. In some situations, the direction 37 is not apparently available, and a similar property of the arrangement of raster points can be defined as follows. An angle is defined between the connecting line 37 and a further connecting line between a center of a third raster point which is different from the raster point 33, located at the edge of the surface portion and immediately adjacent to raster point 35 and a center of a raster point which is different from the raster point 35, located at the edge of the surface portion and immediately adjacent to the raster point 33. Also this angle is smaller than 20° and in particular smaller than 10°.

Figure 5:
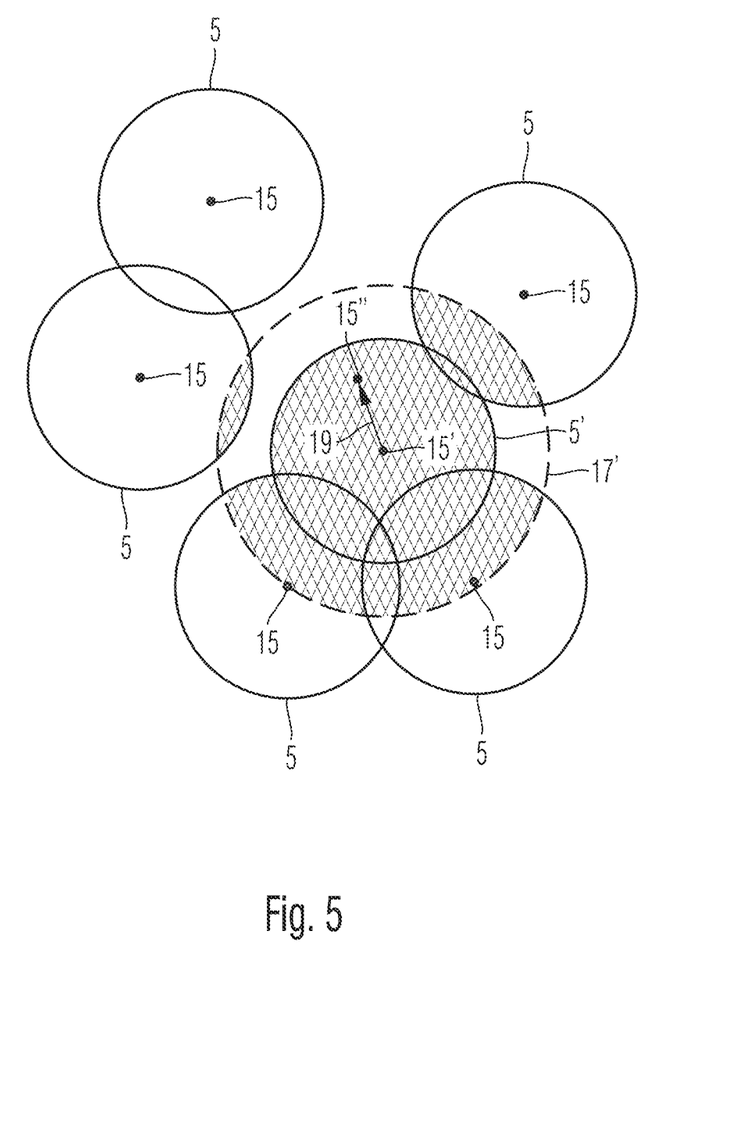
FIG. 5 is a diagram illustrating steps for changing of positions of raster points.

FIG. 5 is a schematic representation illustrating a step of changing a position of a raster point. FIG. 5 shows positions 15 and 15' of six raster points 5 and 5'. The raster points 5 and 5' are represented by circles having a diameter selected such that they correspond to a diameter of the particle beam on the surface portion to be scanned on the surface of the object. Of course, in practice, the particle beam does not have a well defined diameter on the surface of the object. An intensity distribution of the particle beam incident on the object may have a Gaussian shape. It is common practice to identify the beam radius with that radius from the beam center at which the intensity is half of the maximum intensity at the center. The circles 5 and 5' in FIG. 5 each represent a raster point such that the center of the circle corresponds to the positions 15 and 15' within the plane at which the center of the beam is directed and that the radius of the circle is selected such that the particle intensity per unit area within the circle is greater than half of the maximum intensity of the particle beam achieved at the center of the circle. The positions 15 and 15' of the raster points 5 and 5' correspond to the centers of the circles representing the raster points.

In the step illustrated with reference to FIG. 5, it is determined whether the position 15' of the raster point 5' is to be changed. For this purpose, a quantity representing the local particle dose is determined. In the illustrated example, this quantity is obtained by determining overlapping surface portions of the circles representing the raster points. For this purpose, the overlap of each of the circles of the raster points 5 with a circle 17' shown in dotted lines about the position 15' is determined. These overlapping portions are hatched in FIG. 5. The hatched surfaces are added, and the resulting sum represents the quantity of the local particle dose per unit area around position 15'. It is assumed that this dose is greater than a desired target dose derived from an average value of the distances of the positions 15 of the raster points 5 from each other. Thereafter, variations of the position 15' are generated and the local particle dose is again determined based on the varied position 15'. The variations of the position 15' can be generated randomly, for example. If the variation of the position 15' results in a reduction of the local particle dose about the varied position, this varied position is used as the new changed position of the raster point 15'.

FIG. 5 shows an arrow 19 representing a distance by which the position 15' is displaced such that the position 15" resulting from the displacement can be used as the changed position of the raster point 15' resulting in a reduction of the local particle dose about the raster point 5'.

Figure 6:
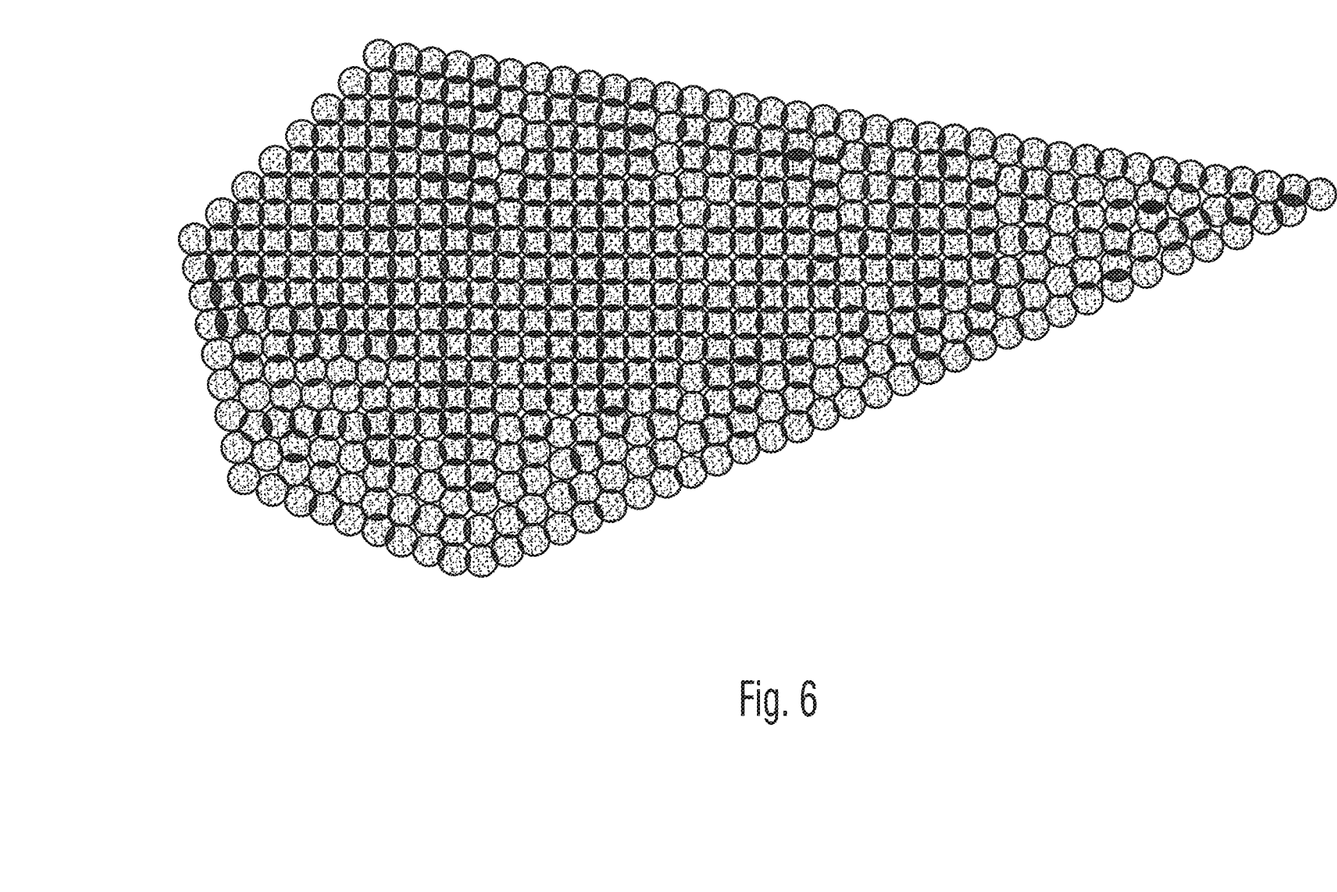
FIG. 6 is a schematic illustration of a further arrangement of raster points obtained by changing of positions of at least some raster points.

FIG. 6 shows a further example of an arrangement of raster points within a surface portion having the same shape as the surface portions shown in FIGS. 3 and 4. The arrangements of raster points shown in FIG. 6 is a result of an iterative repetition of the changing of positions of some raster points such that local deviations of the particle dose from a predetermined target dose are reduced. The arrangements of raster points shown in FIGS. 4 and 6 are both obtained by changing the positions of some raster points such that local deviations of the particle dose from a predetermined target dose are reduced until a satisfactory result is obtained. However, the arrangements of raster points within the surface portion shown in FIGS. 4 and 6 are different because different arrangements of initial positions of the raster points are used in FIGS. 4 and 6, respectively. The arrangement of raster points shown in FIG. 3 forms the initial positions of the raster points used to obtain the arrangement shown in FIG. 4. The initial positions of FIG. 3 were generated by placing the raster points as illustrated above, i.e. starting on the edge and spiraling from outside to inside. The arrangement of initial positions used for obtaining the arrangement of raster points shown in FIG. 6 was different in that the initial positions of the raster points located at the edge of the surface portion were generated by placing raster points adjacent to each other along the edge of the surface portion. However, the initial positions of the raster points located in the interior of the surface portion were generated by placing the raster points on a regular lattice. Using such initial positions results in deviations of the local particle dose from the desired target value especially in a region between the edge of the surface portion and the interior of the surface portion. However, these deviations are reduced by repeatedly changing the positions of some raster points until the result shown in FIG. 6 is achieved.

Figure 7:
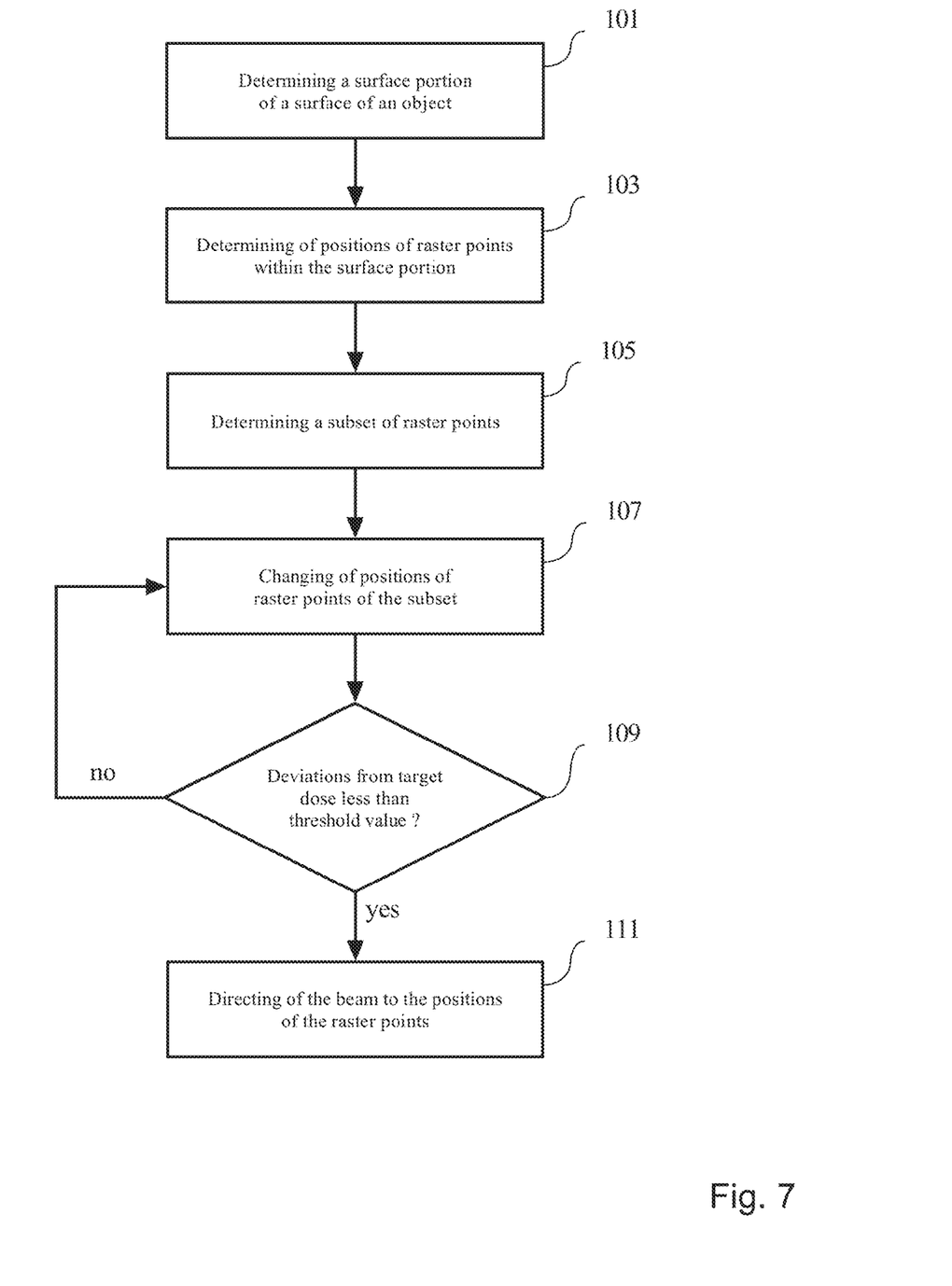
FIG. 7 is a flow-chart illustrating a method of scanning a surface of an object using a particle beam.

Embodiments of the methods illustrated above are summarized with reference to the flow-chart of FIG. 7 below. A surface portion to be scanned of a surface of an object is determined in a step 101. Raster points are placed within the surface portion in a subsequent step 103, wherein a number of the raster points, is, for example, determined based on a size of the surface portion to be scanned and a desired target dose per unit area. The initial positions of these raster points are determined in step 103.

Thereafter, a subset of these raster points is determined in a step 105. For example, this subset may only contain those raster points which are not located immediately on the edge of the surface portion. According to another example, the subset contains only those raster points which are not located on the edge of the surface portion and a low number, such as 20% or less of the raster points located on the edge of the surface portion.

Thereafter, the positions of the raster points of the subset are changed in a step 107, and deviations of the expected particle dose from the target dose are determined in a step 109 based on the assumption that the surface portion is scanned using the positions of the raster points determined in step 107.

Since the raster points located on the edge of the surface portion or only the low number of raster points located on the edge of the surface portion are not contained in the subset of positions which are changed in step 107, the positions of the raster points on the edge of the surface portion are substantially fixed such that the changing of the positions of the raster points in step 107 does not change the shape of the surface portion.

If it is then determined in a step 109 that the deviations from the target dose are smaller than a predetermined threshold value, the positions of the raster points within the surface portion are maintained unchanged, and the processing continues with step 111 in which the particle beam is directed to the positions on the surface of the object as determined in previous step 107. If it is determined in step 109 that the deviations from the target dose are greater than the predetermined threshold value, the processing continues with step 107 in which the positions of the raster points within the surface portion are changed again such that the condition of step 107 is possible fulfilled thereafter. The changing of the positions of the raster points within the surface portion in step 107 is performed as often as necessary until the deviation of the expected particle dose from the target dose is smaller than the threshold value. A substantially uniform distribution of the target dose across the surface portion is then obtained in step 111.

The embodiments of the method of determining positions of raster points illustrated above use a particle beam system producing an electron beam and an ion beam. In other examples, an ion beam generated by a gas field ion source is used for inspecting the object rather than an electron beam. In such system, two ion beams are generated, wherein a first ion beam is used for manipulating the object and a second ion beam, generated by the gas field ion source is used for generating an image of the object by detecting particles generated by the incident second ion beam.

In a further exemplary embodiment of a system, the system generates only one ion beam using a gas field ion source. In such embodiment, the ion beam is subsequently or simultaneously used for activating a process gas for manipulating the object and for the generation of images of the object by detecting particles released from the object due to the incidence of the ion beam.

In still further embodiments of a system, only one electron beam is generated which is used both for activating the process gas and for generating image signals from the object.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A method of scanning a surface of an object using a particle beam, wherein the method comprises:
   determining an area of the surface of the object to be scanned;
   determining initial positions of a set of raster points within the area of the surface of the object to be scanned, wherein the initial positions are based at least in part on the shape of the area of the surface of the object to be scanned and on the initial positions of raster points whose initial positions have previously been determined, if any, such that the initial positions of the raster points are not arranged in a regular two-dimensional array;
   changing the initial positions of at least some raster points of the set of raster points, the changing of the initial positions of the at least some raster points comprising changing positions of centers of the at least some raster points, wherein the changed positions of the centers of the at least some raster points are within the area of the surface of the object to be scanned, wherein the changing of the initial positions of the at least some raster points of the set of raster points is performed such that local deviations of a particle dose from a predetermined target dose occurring when the area of the surface of the object to be scanned is scanned by directing the particle beam to the changed positions are smaller than local deviations of a particle dose from the predetermined target dose occurring when the area of the surface of the object to be scanned was scanned by directing the particle beam to the initial positions of the set of raster points within the area of the surface of the object to be scanned; and,
   determining final positions of the set of raster points;
   scanning the area of the surface of the object to be scanned by directing the particle beam to the final positions of the raster points.

2. The method according to claim 1, wherein the changing of the initial positions of the some raster points of the set of raster points is performed repeatedly.

3. The method according to claim 1, wherein the determining of the initial positions of the raster points within the area of the surface of the object to be scanned is based on the shape of the area of the surface of the object to be scanned such that for more than 80% of all pairs of raster points which are located immediately adjacent to each other and at an edge of the area of the surface of the object to be scanned the following holds: an angle between an orientation of a connecting line between centers of the raster points of the pair and a direction of extension of the edge of the area of the surface of the object to be scanned is smaller than 20° in a region around the raster points.

4. The method according to claim 1, wherein the initial positions of the raster points within the area of the surface of the object to be scanned are determined such that for more than 80% of all pairs of raster points which are located immediately adjacent to each other and at an edge of the area of the surface of the object to be scanned the following holds: an angle between an orientation of a connecting line between a center of a first raster point of the pair and a center of a second raster point of the pair and an orientation of a connecting line between a center of a third raster point which is different from the second raster point, located at the edge of the area of the surface of the object to be scanned and immediately adjacent to the first raster point and a center of a fourth raster point which is different from the first raster point, located at the edge of the area of the surface of the object to be scanned and immediately adjacent to the second raster point is smaller than 20°.

5. The method according to claim 1, wherein the initial positions of only a subset of the set of raster points are changed.

6. The method according to claim 5, wherein at least 80% of the raster points located at an edge of the area of the surface of the object to be scanned are not contained in the subset.

7. The method according to claim 1, wherein the determining of the initial positions of the set of raster points within the area of the surface of the object to be scanned comprises the following activities:
   (a) determining a position of a first raster point such that it is located at an edge of the area of the surface of the object to be scanned, and
   (b) repeatedly determining a position of a subsequent raster point such that the subsequent raster point is located at the edge of the area of the surface of the object to be scanned and immediately adjacent to the raster point whose position has been determined immediately before.

8. The method according to claim 7, wherein activity (b) is repeated until the subsequent raster point is located immediately adjacent to the first raster point.

9. The method according to claim 7, wherein the determining of the initial positions of the set of raster points within the area of the surface of the object to be scanned comprises:
   (c) repeatedly determining the initial position of a subsequent raster point such that the subsequent raster point is located immediately adjacent to the raster point whose position has been determined immediately before and such that it is located immediately adjacent to a raster point whose position has been determined before.

10. A particle beam apparatus comprising:
   a particle beam generator for generating a particle beam;
   a beam deflector configured to direct the particle beam to selectable locations on the area of the surface of the object; and
   controller configured to control the beam deflector such that the object is scanned according to the method of one of claims 1, 2 or 3-9.

11. A method of scanning a surface of an object using a particle beam, wherein the method comprises:
   determining an area of the surface of the object to be scanned;
   determining initial positions of a set of raster points within the area of the surface of the object to be scanned, wherein the initial positions are based at least in part on the shape of the area of the surface of the object to be scanned and on the initial positions of raster points whose initial positions have previously been determined, if any, such that the initial positions of the raster points are not arranged in a regular two-dimensional array;
   changing the initial positions of at least some raster points of the set of raster points, the changing of the initial positions of the at least some raster points comprising changing positions of centers of the at least some raster points; wherein the changed positions of the centers of the at least some raster points are on the area of the surface of the object to be scanned;
   wherein the initial positions of only a subset of the set of raster points are changed, and wherein at least 80% of the raster points located at an edge of the area of the surface of the object to be scanned are not contained in the subset; and, determining final positions of the set of raster points;
   scanning the area of the surface of the object to be scanned by directing the particle beam to the final positions of the raster points.

12. The method according to claim 11, wherein the changing of the initial positions of the at least some raster points of the set of raster points is performed such that local deviations of a particle dose from a predetermined target dose occurring when the area of the surface of the object to be scanned is scanned by directing the particle beam to the changed positions are smaller than local deviations of a particle dose from the predetermined target dose occurring when the area of the surface of the object was scanned by directing the particle beam to the initial positions of the set of raster points within the area of the surface of the object to be scanned.

13. The method according to claim 11, wherein the changing of the initial positions of the some raster points of the set of raster points is performed repeatedly.

14. The method according to claim 11, wherein the determining of the initial positions of the raster points within the area of the surface of the object to be scanned is based on the shape of the area of the surface of the object to be scanned such that for more than 80% of all pairs of raster points which are located immediately adjacent to each other and at an edge of the area of the surface of the object to be scanned the following holds: an angle between an orientation of a connecting line between centers of the raster points of the pair and a direction of extension of the edge of the area of the surface of the object to be scanned is smaller than 20° in a region around the raster points.

15. The method according to claim 11, wherein the initial positions of the raster points within the area of the surface of the object to be scanned are determined such that for more than 80% of all pairs of raster points which are located immediately adjacent to each other and at an edge of the area of the surface of the object to be scanned the following holds: an angle between an orientation of a connecting line between a center of a first raster point of the pair and a center of a second raster point of the pair and an orientation of a connecting line between a center of a third raster point which is different from the second raster point, located at the edge of the area of the surface of the object to be scanned and immediately adjacent to the first raster point and a center of a fourth raster point which is different from the first raster point, located at the edge of the area of the surface of the object to be scanned and immediately adjacent to the second raster point is smaller than 20°.

16. The method according to claim 11, wherein the determining of the initial positions of the set of raster points within the area of the surface of the object to be scanned comprises the following activities:
   (a) determining a position of a first raster point such that it is located at an edge of the area of the surface of the object to be scanned, and
   (b) repeatedly determining a position of a subsequent raster point such that the subsequent raster point is located at the edge of the area of the surface of the object to be scanned and immediately adjacent to the raster point whose position has been determined immediately before.

17. The method according to claim 16, wherein activity (b) is repeated until the subsequent raster point is located immediately adjacent to the first raster point.

18. The method according to claim 16, wherein the determining of the initial positions of the set of raster points within the area of the surface of the object to be scanned comprises:
   (c) repeatedly determining the initial position of a subsequent raster point such that the subsequent raster point is located immediately adjacent to the raster point whose position has been determined immediately before and such that it is located immediately adjacent to a raster point whose position has been determined before.

19. A particle beam apparatus comprising:
   a particle beam generator for generating a particle beam;
   a beam deflector configured to direct the particle beam to selectable locations on the area of the surface of the object; and
   controller configured to control the beam deflector such that the object is scanned according to the method of one of claims 11-13 or 14-18.

* * * * *